United States Patent [19]

Weresch

[11] 4,387,500
[45] Jun. 14, 1983

[54] APPARATUS FOR OPERATING UPON CONNECTING WIRES OF ELECTRIC COMPONENTS

[76] Inventor: Thomas Weresch, Greschbachstr. 19, D-7500 Karlsruhe 41, Fed. Rep. of Germany

[21] Appl. No.: 187,995

[22] Filed: Sep. 17, 1980

[51] Int. Cl.³ .................... B23P 23/00; B21F 45/00
[52] U.S. Cl. ................................. 29/566.3; 83/345; 83/435; 83/449; 140/1; 140/105
[58] Field of Search ............ 140/105, 1; 29/566.3; 83/345, 435, 449

[56] References Cited

U.S. PATENT DOCUMENTS

| | | | |
|---|---|---|---|
| 3,147,779 | 9/1964 | Brown | 140/105 X |
| 4,096,891 | 6/1978 | Suzuki et al. | 140/1 |
| 4,108,217 | 8/1978 | Westberg | 140/105 |
| 4,200,018 | 4/1980 | Sekiwa | 83/435 X |
| 4,206,539 | 6/1980 | Weresch | 140/105 X |
| 4,211,131 | 7/1980 | Fennetal | 83/435 X |
| 4,221,244 | 9/1980 | Weresch | 140/105 |
| 4,229,964 | 10/1980 | Weresch | 140/105 X |
| 4,249,581 | 2/1981 | Weresch | 140/105 |
| 4,276,796 | 7/1981 | Weresch | 83/345 X |

*Primary Examiner*—Frank T. Yost
*Attorney, Agent, or Firm*—Antonelli, Terry & Wands

[57] ABSTRACT

An apparatus for preparing leads for electrical components having a sliding guide with a guide slot for conveying the components, a cutting device for cutting the leads to length, and at least one tool set having two tools which are cooperable for shaping the connecting leads between them. At least one of the tools is operable to move against the other by a closing movement in a direction which is perpendicular to the guide slot, while both of the tools are jointly movable parallel to one another, in an operating movement, in such a manner that the closing movement of the tools set is synchronized with the operating movement so as to cause the tools to be closed during a part of the operating movement which takes place in a direction in which the components are conveyed and are opened in an opposite direction.

30 Claims, 13 Drawing Figures

APPARATUS FOR OPERATING UPON CONNECTING WIRES OF ELECTRIC COMPONENTS

BACKGROUND AND SUMMARY OF THE INVENTION

The invention relates to an apparatus for bending, kinking and cutting to length the connecting wires of electrical components, with a storage container for the components, with at least one tool set comprising two tools which operate against each other and shape the connecting wires between them and are adapted for bending and kinking, with a conveying device which is connected to the storage container and is adapted to supply the components to the tool set, and with a cutting device for cutting the connecting wires to length.

Electrical components leave the production process with linear connecting wires which must be bent, kinked and cut to length for wiring and electrical connecting purposes. These operations can be performed relatively simply for cylindrical components in which the connecting wires extend from opposite end faces of the component, because as a rule these connecting wires are bent in one direction and are also provided with identical kinks. To this end, the prior art discloses devices (see U.S. Pat. No. 3,900,053) in which the components are taken up by the two connecting wires in the tooth gaps of gear-like conveying wheels arranged in pairs. The components are guided by means of the said conveying wheels past the forming and cutting tools.

By contrast, the present invention relates to the processing of components whose connecting wires do not appear coaxially at opposite sides of the component member but emerge adjacently on one side of the component member. By virtue of their asymmetrical construction, such components cannot be readily conveyed and supplied continuously to processing stations. Furthermore, the connecting wires must frequently be bent and kinked into different directions, which is also not possible with the devices described above. A device of the kind described initially is known from practical operation and is described in U.S. Pat. No. 4,206,539, in which said device one or more tool sets is or are disposed on the circumference of a support plate which is rotatable about a stationary axis and one of the tools can be pivoted about a pivoting axis, parallel to the axis of rotation, in relation to the second, stationary tool, and in the course of rotation of the support plate can be driven by a stationary disc cam from an open position into a closed position and back again. At a place of transfer to the circulating tools the conveying device is provided with a transfer slot which is disposed approximately at the height of the tools and extends in the circulating direction thereof and is open in that direction and each supporting one component which is to be transferred and whose connecting wires extend downwardly through the slot. Each of the components to be processed is transferred to one circulating tool set in the course of the circulation of which the connecting wires are being processed. Before the transfer operation, the pivotable tool is controlled by the disc cam so that, with the tools in the open position, the component, which is supported in the transfer slot, is gripped by the tool which trails in the circulating direction and the tools are subsequently closed.

This known device of the kind described hereinbefore has proved itself in excellent manner because, on the one hand, it permits exceptionally high processing capacities to be achieved and, on the other hand, allows simple changing of the tool sets without complicated adjusting operations. However, a plurality of identical tool sets is necessary on the circumference of the support plate in order to achieve such high processing capacities. Furthermore, relatively large masses must be moved so that a relatively high complexity is involved in the construction and in the drive and this can be regarded as detrimental in cases calling only for medium processing capacities.

An object of the invention is a device of the kind described hereinbefore, which can be embodied at low expenditure, more particularly has only small moving masses, but nevertheless permits high processing capacities to be achieved. The possibility of simple tool changing without complicated readjustment is of course to be retained.

According to the invention, the problem is solved in that the tool set is arranged to be stationary (i.e., naturally stationary in relation to the machine casing) or simply reciprocable and is associated with a stationary component guide, that the component guide comprises a guide way with a guide slot and the connecting wires extend through the guide slots and project downwardly into the operating range of the tool set and that the tools of the tool set can be adjusted along a plane which is perpendicular to the guide slot, and moved in a direction which is perpendicular to the guide slot. According to one preferred embodiment, the component guide is associated with a friction drive for the components. A plane, extending parallel with the plane of the boundaries forming the guide slot, is described as being perpendicular to the guide slot. The guide slot, which is provided in accordance with the invention and is usually constructed in rectilinear form, must not be confused with the conveying means, also constructed in slot-shaped manner, and disposed between the storage container and the processing station, which said conveying system is present in the known device as well as in the device according to the invention. The component guide according to the invention with guide slot is provided to retain and guide the components during the processing operation by contrast to the known device in which the components are retained and guided solely by the tools during processing. Transfer of the components in the component guide, i.e., in the actual operating range of the tools, is preferably performed in accordance with the invention by a friction drive. A drive (provided, e.g., by a vibrator or by a friction drive) can of course also be provided in the region of the conveying system. As regards the friction drive which may be provided in accordance with the invention and will be explained hereinbelow in detail, it is essential in every case that the components are conveyed not by positive engagement with the drive element, but solely non-positively, e.g., by frictional engagement in the guide way. Such a friction drive does not interfere with the processing operation during which the components must be stopped, at least briefly, because, owing to frictional engagement, the friction drive simply continues to operate with slip while the components are stopped. The tools, e.g., arranged in stationary configuration, can be readily preadjusted as a complete tool set and can be attached to the device according to the invention, so that tool changing for the purpose of changing to a different processing function, can be performed in a simple manner.

Advantageously, such a friction drive has at least one drive element in the form of a rotatingly driven friction roller or of a circulating friction belt which imparts a feed force to the components in the direction of the guide slot. The surface, which acts on the components, of the friction roller or the friction belt has a frictional characteristic which ensures reliable feeding of the components. To this end, they can be constructed of rubber, soft plastics or foam material or they can have a friction-increasing covering of rubber, foam substances or the like. Furthermore, the frictional roller or the friction belt can be constructed as a brush roller or can be provided with a brush covering.

It is possible to provide only one driving element which acts on the top of the component members and functions simultaneously as work holder to thrust said components against the guide way. It is also possible to provide two driving elements which act on opposite sides of the components, either on the connecting wires or preferably on the component member. This embodiment is particularly recommended if the component member is relatively tall and narrow and, therefore, bears with only a narrow surface on the guide way.

In order to adjust the connecting wires to different lengths, it is recommended to arrange the tool set on a drive block which can be raised and lowered in relation to the guide slot, more particularly by being guided on guide rods and being vertically adjustable by means of a spindle which is fixed to the machine.

Different means are available for arranging and actuating the tools of the tool set. On the one hand, one of the tools can be arranged fixedly with respect to the machine and the other tool displaceable relative thereto. This permits a particularly simple means of performing tool actuation. To ensure trouble-free insertion of the connecting wires into the tool, which is fixed to the machine, it can be advisable for a ramp, inclined in relation to the conveying direction, to be arranged upstream of the said tool. On the other hand, both tools of the tool set can be adjustable relative to each other. Symmetrical operation of the tools is desirable so that, in the end position, the parting joint between the closed tools, which mesh with each other, is situated symmetrically beneath the guide slot. The tools can be actuated in conventional manner by a motor with an eccentric, disc cam or the like or by means of a plunger magnet or solenoid.

The tools can be opened after each operation by means of an opening spring against whose action the tools are moved into the closed position. To overcome the inertia of the tools at higher operating speeds, it may be necessary to provide an opening with an undesirably high spring force. Positive opening of the tools by the tool drive is recommended, at least in such cases.

It is possible for the bent and kinked connecting wires to jam in the tools without being readily released. This defect can be overcome by combining one of the tools with an ejector lever by means of which the components are ejected from the second tool after processing when the tools are opened. By suitable design of tools, it is possible to achieve the preferred case in which the components are forcibly ejected from the tool which is fixed to the machine and, accordingly, the ejector lever is coupled to the adjustable tool. In some circumstances both tools can be provided with ejector levers which are alternately coupled to each of the second tools.

Satisfactory synchronization of the component feed in the guide way with the operation of the tools is of particular significance for functioning of the device according to the invention. In one method to achieve this end the guide slot is associated with a movement monitor in the form of a photoelectric barrier, a proximity switch or the like, and operation of the tool set is triggered by the movement monitor. Another possibility, characterized by its great simplicity, consists in associating the guide slot with a component trap having at least one separating slide, which can be inserted in the guide slot, and by arranging for actuation of the separating slide by the drive of the tool set. The separating slide can be arranged either as a stop slide behind the tools and/or it can be arranged upstream of the tools in the form of a release slide. With due allowance for the conveying speed of the friction drive, control of the stop slide and of the tools with respect to time can be arranged, so that the tools are closed only when the appropriate component bears, in the predefined processing position, against the stop slide. It is also possible to construct the stop slide as an actuating element of a switch by means of which tool actuation is triggered when a component bears upon it. Satisfactory results can also be achieved solely by means of a release slide arranged upstream of the tools, if tool actuation is triggered with corresponding delays after removal of the release slide from the guide slot, with due allowance to the conveying speed of the friction drive. Combining the stop slide and the release slide into a "trap" in the narrower sense has also been found advantageous in some cases.

Different means are available for embodying the tools, depending on the kind of components which have to be processed. A compact, closed tool set by means of which the connecting wires are spread apart, bent and kinked in accordance with the pitch of the circuit into which they are to be inserted, is recommended for transistors or the like whose connecting wires emerge from one side of the component. The corresponding construction of the tools is described in detail in the applicants' U.S. Pat. No. 4,206,539.

The apparatus according to the invention can also be advantageously used for processing components whose connecting wires emerge coaxially from opposite sides of the component member. Components of this kind can be processed with the known device, which was initially described, but only in a manner in which the kinks on both connecting wires extend in the same direction. In practice, it has been found that components provided with kinks in this manner are not positioned accurately vertically in the desired manner when they are inserted into the connecting apertures of a circuit board. This defect can be eliminated by providing the connecting wires with kinks oriented in opposite directions. This can be achieved by initially bending the connecting wires in the same coplanar direction from the component member and by processing them with the device according to the invention. In accordance with the distance between the connecting wires, which said distance will then be relatively large, each of the tools are constructed with two tool portions which cooperate in pairs and are situated at a corresponding and, where appropriate, adjustable distance in the direction of the guide slot. One tool portion, more particularly, the front tool portion, of each tool can be constructed in relatively narrow form, since the position of one of the connecting wires can be correspondingly accurately predefined for the processing operation. The second and, more particularly, rear tool portion of each tool will have a greater width in accordance with the varying distance of the connecting wires, which said distance depends on the size of component and on the particular case. This ensures that both connecting wires are reliably gripped by the tools. Proceeding therefrom, the two connecting wires can readily be provided with oppositely oriented kinks in that the tool portion regions, adapted to form the kinks (usually an indentation of a tool portion and a projection of the second tool portion adapted to engage with the former), are arranged in opposite configuration on the front and rear tool portions.

The connecting wires can be cut to length in a simple manner by providing the underside of the tools with shearing tools. Usually, shearing tools can be rigidly connected to the bending and kinking tools because the necessary distance between the kink and the wire ends is substantially defined only by the thickness of the circuit board and, in practice, is hardly ever subject to change. Where appropriate, the vertical distance of the shearing tools from the bending and kinking tools can also readily be made adjustable. Another method is to provide a separate cutting device upstream or downstream of the tool set comprising the bending and kinking tools and, to this end, the guide slot is extended without interruption, at least as far as the cutting device. A construction described in U.S. Pat. No. 4,276,796 is recommended for such a separate cutting device which substantially provides two shearing wheels, each provided with a circumferential cutting edge, of which at least one shearing wheel is rotatably drivable and is provided with a serration.

Unless special precautions are taken, there is a risk of tensile stresses loosening the connecting wires in the component member when said connecting wires are processed by bending and kinking. This can be remedied by applying pull relief to the connecting wires when they are being processed. The provision above each of the two tools for bending and kinking of a holder or work holder adapted to clamp the connecting wires of the component directly beneath the component member is one possibility of applying such pull relief, both of the two holders or work holders being supported so as to have limited movability relative to their associated tool under the action of a spring and of a stop abutment in such a way that, during the closing motion of the pivotable tool, the holder associated therewith is entrained until it bears upon the work holder and subsequently (while clamping the connecting wires) and at the commencement of the actual operating motion the work holder is also entrained against the action of the spring supporting the same and finally, when the holder and work holder are at rest, the pivotable tool is moved into the limiting position against the spring which supports the holder while the connecting wires are bent and kinked. This has already been described in detail in the previously mentioned U.S. Pat. No. 4,206,539 of the applicant.

Providing adjustability for a portion of at least one of the boundaries of the guide slot in the region of the tool set with respect to the second boundary is another possibility of achieving pull relief and is characterized by particular simplicity and reliability within the scope of the present invention. In such a system, the boundaries of the guide slot are also used as clamping jaws to provide pull relief. Adjustment of the corresponding portion of one or both of the boundaries of the guide slot is of course performed until the connecting wires are clamped, namely, in synchronism with the operation of the tools, more particularly, by the tool drive itself. To maintain a specific predefined clamping force, it is advisable to allow the drive to act on the corresponding portion of the guide slot boundary not directly but via a spring of a predefined spring force.

To reliably avoid pull being applied to the connecting wires of the components, an effect which could lead to damage of the components due to loosening of the connecting wires under unfavorable circumstances, another embodiment provides that the tool set is reciprocable within an operating range (operating motion), that the closing motion is synchronized with the operating motion so that, during the portion of the operating motion, which takes place in the conveying direction, the tools are closed and they are opened in the opposite direction and that the guide way terminates in the operating range of the tool set. The invention, therefore, ensures that the tool set is not completely fixed in relation to the component guide but performs a reciprocating operating motion within an operating range which is stationary with respect to the component guide. In this system, the components are transferred not by a friction drive, but by virtue of the fact that the components are gripped by the tools, are removed from the component guide which terminates in the operating range of the tools and the component connecting wires are processed outside the component guide. This does not, of course, dispense with the need for the components to be supplied in suitable manner to the operating range, for example, by the action of gravitational force in the component guide which is arranged at a slope. It is, of course, also possible to provide an additional friction drive. In every case it is essential that, during processing, the components are transferred to the tools by virtue of the latter being closed at or after the front dead centre of the operating motion and processing takes place while the tools perform the operating motion stroke which extends in the conveying direction and at the end of the said stroke the tools are again opened and the processed components are ejected.

The operating motion and the closing motion can extend parallel with each other and, jointly, substantially perpendicular to the orientation of the guide slot. In this case, a transfer slot, which is parallel with the operating motion, is disposed downstream of the guide slot. It is, however, particularly advantageous if the operating motion is arranged parallel with the guide slot and substantially perpendicular to the closing motion of the tools. Advantageously, the operating motion of the tools is performed so that the latter are adjustably supported on a slide which can traverse in accordance with the operation motion in a slide way which is stationary with respect to the guide way. The operating motion can be imparted to the slide, for example, by a hydraulic or pneumatic cylinder-piston system or by means of a connecting rod from a rotating motor. At least one of the tools is adjustable with respect to the slide. This adjustment can be performed by arranging for the tools to be linearly adjustable by means of suitable guides or preferably by supporting the tools pivotably. To this end, it is advisable if, initially, the tools are fixedly mounted on corresponding tool holders which, in turn, are adjustably supported on the slide. The closing motion of the tools is made possible by the adjustable support of the tools or tool holders and can be performed, for example, by means of at least one plunger magnet and energization of the plunger magnet can be controlled by control switches which are actuated by the tool set or by the slide via control cams mounted thereon and disposed along the operating range. Correspondingly, the closing motion can be performed by hydraulic or pneumatic cylinder-piston systems whose control elements are actuated by switch cams associated with the tool set or the slide. In another method, which is characterized by particular simplicity, the closing motion of the tools is performed by at least one disc cam which is disposed along the operating range and at least one of the tools, namely, the tool performing the closing motion, i.e., both tools if both are adjustable, are connected to a control finger adapted to cooperate with the disc cam. Advantageously, each control finger or plunger magnet acts on the tool support. It is usually advisable for both tools to be adjustable within the range of the closing motion. This applies particularly to the previously-explained case in which no additional transfer slot is provided and the operating motion is performed in a direction which is parallel with the guide slot of the component guide. Accordingly, in this case, two disc cams are provided of which each controls one of the tools.

After processing, the tools can be opened by being biased by an opening spring in a direction opposite to the closing motion. In this case, each of the disc cams will have only one control cam, namely, a closing cam. Another method, particularly advantageous for high operating speeds, consists of the disc cams having an opening cam and a closing cam. In this case, the control fingers will be guided by the cams over a closed path. so that the tools are moved in the closed position in the conveying direction and in the open position in the opposite direction.

When using pull relief elements in the form of holders and work holders disposed above the tools, as already explained above, each bearing, by means of a spring on the corresponding tools and being supported so as to have limited movability, it is advisable for the tools to be vertically adjustable in relation to the slide, independently of the pull relief elements. This ensures that the components are always gripped and retained by the pull relief elements in the same position while the position at which the connecting wires are kinked and bent can be set for vertical adjustment of the tools.

With respect to individualizing the components and transferring them to the tool set, it is advisable that, at the region which is at the rear of the device, a separating slide is fixedly connected to at least one of the tools and/or pull relief elements. This ensures that, when a component is gripped between the tools, the succeeding components are retained by the separating slides so as to obviate any faults during transfer. This embodiment is recommended particularly if the operating motion is performed parallel with the guide slot.

It is also advisable to close the end of the guide slot by a spring-biased locking element by means of which each leading component is retained in a defined position for transfer to the tools. During transfer, each such component is obtained while overcoming the spring force. The locking element can be constructed, for example, as a simple leaf spring associated with a cam which projects into the slot.

Since the components, whose connecting wires have been processed, are ejected generally no later than the end of the operating motion of the tools, it is advisable that the connecting wires shall have been cut to the specified length no later than that time. To this end, corresponding cutting tools can be directly associated with the tools for bending and kinking, as already described above. A cutting device, which is disposed beneath the guide slot upstream of the tools in the conveying direction and is preferably adapted to be independently and vertically adjustable in relation to the component guide, represents another particularly advantageous possibility.

These and further objects, features and advantages of the present invention will become more obvious from the following description when taken in connection with the accompanying drawings which show, for purposes of illustration only, several embodiments in accordance with the present invention.

DETAILED DESCRIPTION OF THE PREFERRED EMBODIMENTS

Figure 1:
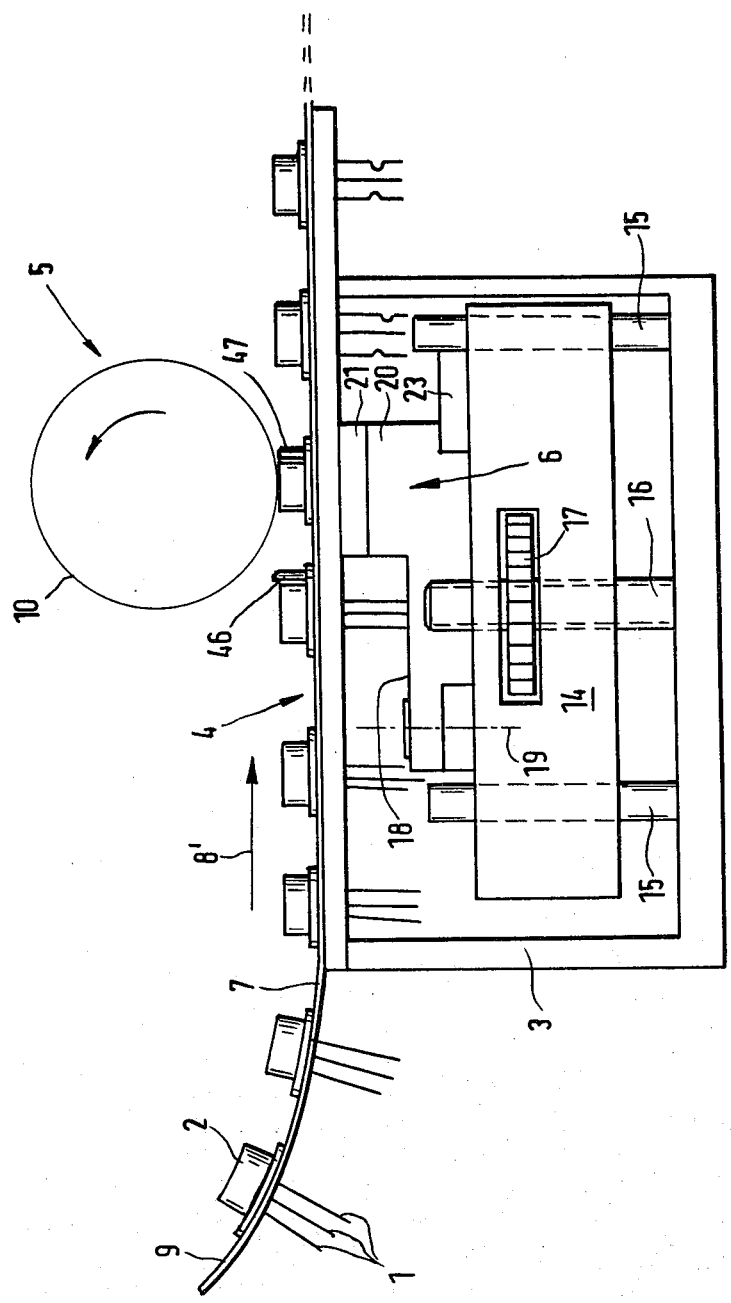
FIG. 1 shows a side view of an apparatus for bending, kinking and cutting to length the connecting wires of electrical components.

The apparatus illustrated in the drawings is intended for bending, kinking and cutting to length the connecting wires 1 of electrical components, in the illustrated example, transistors 2, and its basic construction, comprises a machine frame 3, a component guide 4, disposed on the top of said machine frame and having an associated friction drive 5, and a tool set 6 which is disposed beneath the component guide 4.

Figure 2:
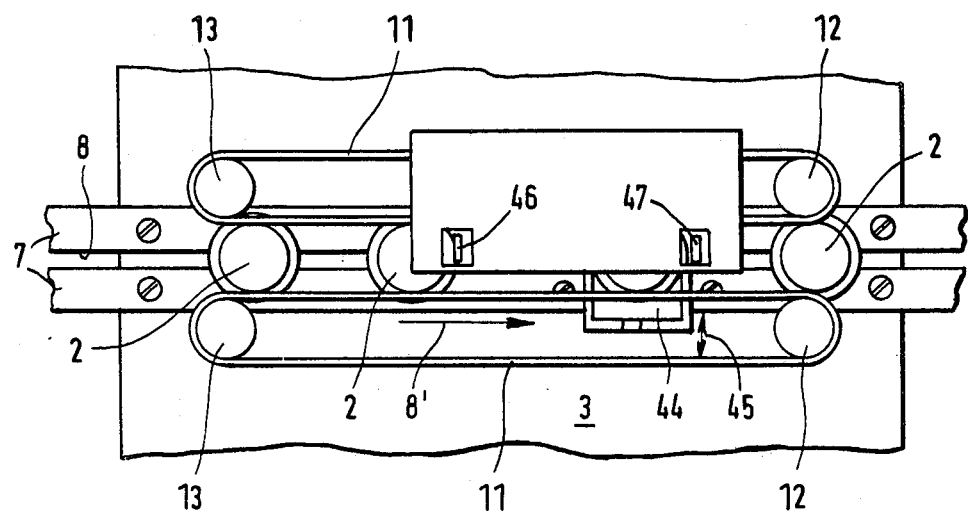
FIG. 2 is a plan view of a modification of the embodiment of FIG. 1.

The component guide 4 is fixedly connected to the machine frame, is constructed as a guide way and substantially comprises two cheeks 7 of spring steel which are arranged parallel with each other and at a distance from each other, are mounted on the top of the machine frame 3 and, between them, leaves open a guide slot 8 (FIG. 2). The component guide 4 is connected to a conveying device 9, which is also constructed as a guide way with a guide slot, and through which the components 2 are supplied from a storage container (not shown), for example, a so-called vibratory cup.

The components 2 are advanced in the conveying direction marked by the arrow 8', and said components 2 bear on the cheeks 7 of the component guide 4, and the connecting wires 1 extend downwardly through the guide slot 8 and project into the operating range of the tool set 6. The forward feed of the components 2, in the region of the inclined conveying device 9, is effected by the action of gravitational force, but, in the operating range of the tool set 6, the feed is effected by the friction drive 5. In the exemplified embodiment illustrated in FIG. 1, the said friction drive comprises a friction roller 10 which is rotatingly driven by a motor (not shown), consists of a foam substance, and acts on the top of the components 2 so that these are advanced by friction in the component guide 4.

FIG. 2 shows a plan of the arrangement on the machine frame of the cheeks 7 which define the guide slot 8. In this case, the friction drive 5 comprises two friction belts 11 of rubber, each being tensioned parallel with the guide slot 8 between an idling roller 12 and a driven roller 13 to act on opposite sides of the components 2 so that these are also moved by frictional engagement in the conveying direction 8' through the component guide 4.

The tool set 6 is disposed on a drive block 14 which is arranged to rise and fall for the purpose of adjusting the length of the connecting wires 1. To this end, the drive block 14 is guided by vertical guide rods 15 and by a spindle 16 which is fixed to the machine. Vertical adjustment is obtained by means of a spindle nut 17 which is rotatably supported by the drive block 14, but is axially non-slidable and can be actuated through an opening of the apparatus side wall (not shown).

The tool set 6, disposed on the top of the drive block 14, substantially comprises two tool supports 18, both of which are supported so as to be pivotable about a vertical axis 19. The distance between the tool supports 18 and the component guide 4 is arranged so that the connecting wires of the components 2, which are to be processed, can pass through without interference. The actual bending and kinking tools 21 are mounted on bent projections 20 of the tool supports 18. After removing the component guide 4, the tools 21 are accessible from above and can readily be removed and exchanged, and the predefined, preadjusted position is ensured by pins 22.

Figure 3:
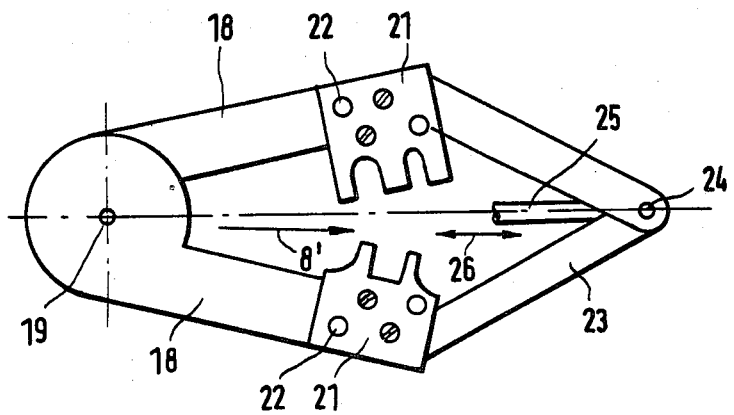
FIG. 3 is a simplified plan view of the tool set associated with the apparatus according to FIG. 1.

In the embodiment illustrated in FIGS. 1 and 3, both tool supports 18 with the tools 21 are symmetrically adjustable relative to each other. Actuation is performed by means of a toggle lever 23 which is hinged to the tool supports 18, and the push rod 25 of a plunger magnet (not shown) acts in the direction of the double arrow 26 on the toggle joint 24, so that actuation of the plunger magnet causes the tools 21 to be opened or closed (FIG. 3).

Figure 4:
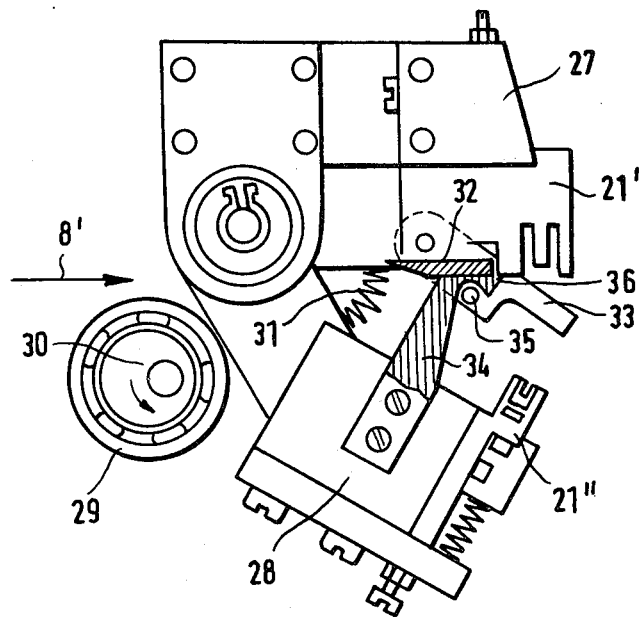
FIG. 4 shows, in plan, another embodiment of a tool set.

In the embodiment illustrated in FIG. 4, the tool set 6 comprises a stationary tool support 27 and a movable tool support 28, which is equipped with the bending and kinking tools 21', 21" and is pivotable about the axis 19 in relation to the fixed tool support. The movable tool support 28 is driven by a prime mover (not shown) and, to reduce friction, is actuated by an eccentric 30, which is provided with a ball bearing 29. Resetting is performed by an opening spring 31. A ramp 32, inclined in relation to the conveying direction 8', precedes the tool 21' of the stationary tool support 27 so that the connecting wires 1 can enter the region of the tools 21', 21" without obstruction.

An ejector lever 33, by means of which the components 2 are ejected from the stationary tool when the tools 21', 21" are again pivoted into the open position after processing, as provided in the exemplified embodiment illustrated in FIG. 4. The said open position is illustrated in FIG. 4. Actuation of the ejection lever 33 is performed by a driver arm 34 which is rigidly connected to the pivotable tool support 28 and grips, by means of a claw 36, behind a pin 35 which is provided on the ejector lever 33. The ejector lever 33 is supported on the stationary tool support 27 so as to be pivotable about a vertical axis. This construction ensures that the ejector lever 33 is positively actuated when the tools are opened.

Further details are disclosed in FIG. 5, which shows different movement phases of the tool set illustrated in FIG. 4. To begin with, it can be seen that the underside of the tools 21', 21" is provided with shearing tools 37, by means of which the connecting wires 1 are cut to their specified length when the tools 21', 21" are in the closed limiting position. It can also be seen that the stationary tool 21', for processing the connecting wires 1, is provided with so-called combs 40, 41 which represent substantially plane configurations, are arranged parallel with each other and are connected at the rear by a tool member 42. The drawing does not disclose that the said comb structures could be mutually displaced in a direction which is perpendicular to the plane of the drawing in accordance with the arrangement of the connecting wires. The movable tool 21" is correspondingly constructed. When the tools 21', 21" are closed, the connecting wires 1 are bent therebetween and are provided with a kink 38. The ejector lever 33 can be recognized between the combs 40, 41 of the stationary tool 21'.

To provide pull relief for the connecting wires 1 during bending and kinking, the tool set according to FIGS. 4 and 5 is provided with work holders 43, which are adjustable against spring bias with respect to the appropriate tools 21', 21" and clamp the connecting wires 1 between them in the manner previously explained, so that the forces which occur during bending and kinking are prevented from acting on the component 2.

Figure 5A:
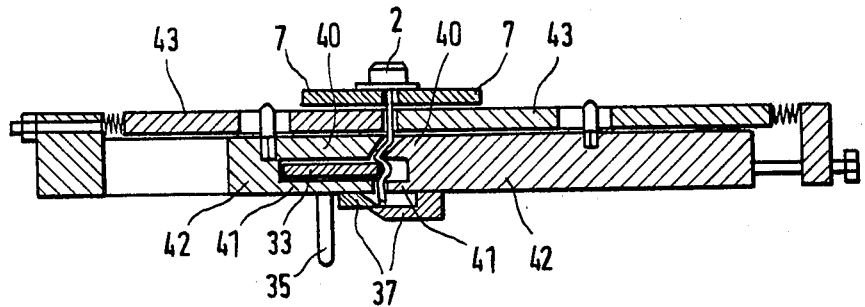
FIGS. 5a, b and c are views from end on of different functional positions of the tool set according to FIG. 4.
Figure 5B:
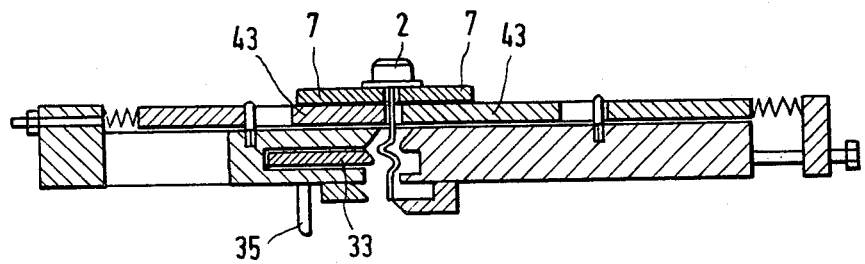
Figure 5C:
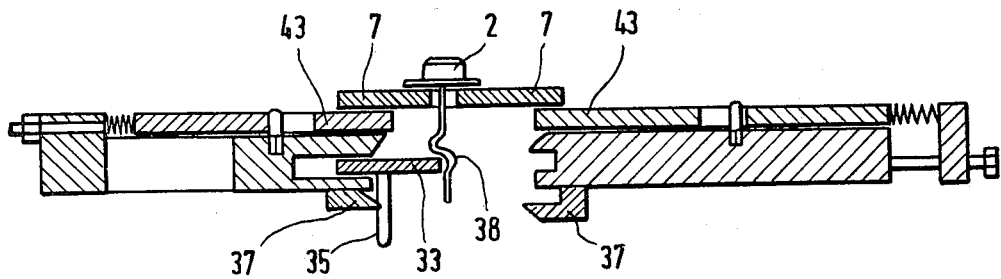

Three movement phases of the tools are shown in simplified form in FIG. 5 to provide an explanation. In the position according to FIG. 5a, the connecting wires 1 are bent, are provided with a kink 38 and have been cut to the specified length by the shearing tools 37. The connecting wires 1 are still clamped between the work holder 43 and the tools 21 are still in their closed position. FIG. 5b shows the commencement of opening when the tools already recede from each other while the connecting wires 1 are still clamped between the work holders 43. The ejector lever 33 is still in its inward pivoted inoperative position. Further opening also causes the work holders 43 to recede from each other. FIG. 5c shows the fully open position of the tools 21', 21" with the outward pivoted ejector lever 33.

In the embodiment according to FIG. 3, the construction of the tools 21 substantially corresponds to that previously explained and an ejector lever 33 (not shown in FIG. 3) can also be provided and can be actuated when the tools 21 are opened. Pull relief for the connecting wires 1 in FIG. 3 is, however, obtained not by means of the work holders as in the case of FIG. 4, but in the manner illustrated in FIG. 2. In this embodiment, one portion 44 of one of the cheeks 7, which define the guide slot 8, is adjustable with respect to the second cheek in the region of the tool sets 6 in a direction which is perpendicular to the guide slot 8 (double arrow 45), namely, by means of a plunger magnet (not shown). Plunger magnet actuation, timed with the actuation of the tools 21, causes the connecting wires 1 to be clamped between the adjustable portion 44 and the oppositely disposed cheek 7 and for pull relief to be applied to such wires.

FIGS. 1 and 2 disclose steps by means of which the supply of components is synchronized with the actuation of the tools 21. Two separating slides 46, 47 are substantially provided to this end and are actuated either by the motor of the tools 21, or, as in the exemplified embodiment, by means of plunger magnets (not shown). To avoid mutual interference with the friction drive 5, the separating slides 46, 47, in the case illustrated in FIG. 1, are adjusted in the horizontal direction, i.e., in the direction which is perpendicular to the plane of the guide slot 8, and, in the case of FIG. 2, they are adjusted in the vertical direction, i.e., along the plane of the guide slot. The leading separating slide (release slide 46) releases the slide of components 2 into the operating range of the tool set 6 only when a processing operation is completed and the machine component 2 has been advanced after retraction of the rear separating slide (stop slide 47). Thereafter, a further component 2 is conveyed into the operating range of the tool set 6 until it bears on the stop slide 47 which has, in the meantime, been advanced into its processing position. The separating slides 46, 47 can be actuated in accordance with the actuation of the tools 21. Conversely, the stop slide 47 can be constructed as the actuating element of a switch by means of which actuation of the tools 21 is triggered at the appropriate time. Suitable mechanical or electronic control means for both methods of use are familiar to the expert skilled in the art.

Figure 6:
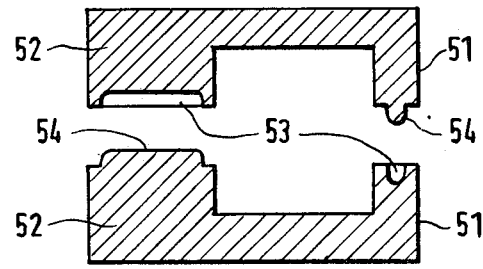
FIG. 6 is a simplified view of another embodiment of a tool set.

The tools explained above by reference to FIGS. 4 and 5 are intended especially for the processing of transistors or similar components whose connecting wires 1 emerge from the component member at a relatively short distance from each other. FIG. 6 illustrates an embodiment for processing connecting wires which are associated with resistors, coiled capacitors or the like, and emerge coaxially from opposite sides of the component member and are bent to the same side of the component member. In accordance with the relatively large distance between the portions of the connecting wires 1 which are to be processed, each of the tools 21 comprise two tool portions, namely, a relatively narrow front portion 51 and a rear tool portion 52, which is relatively broad in the direction of the guide slot 8. FIG. 6, representing a greatly simplified cross section in plan through the tools 21, shows the manner in which the recesses 53 and projections 54 of associated tool portions 51 and 52, between which the kinks 38 are formed, are arranged on the front and rear tool portion 51 and 52 in opposite directions with respect to the guide slot 8. Accordingly, after processing, the two connecting wires will have kinks 38 oriented in opposite directions.

Figure 10:
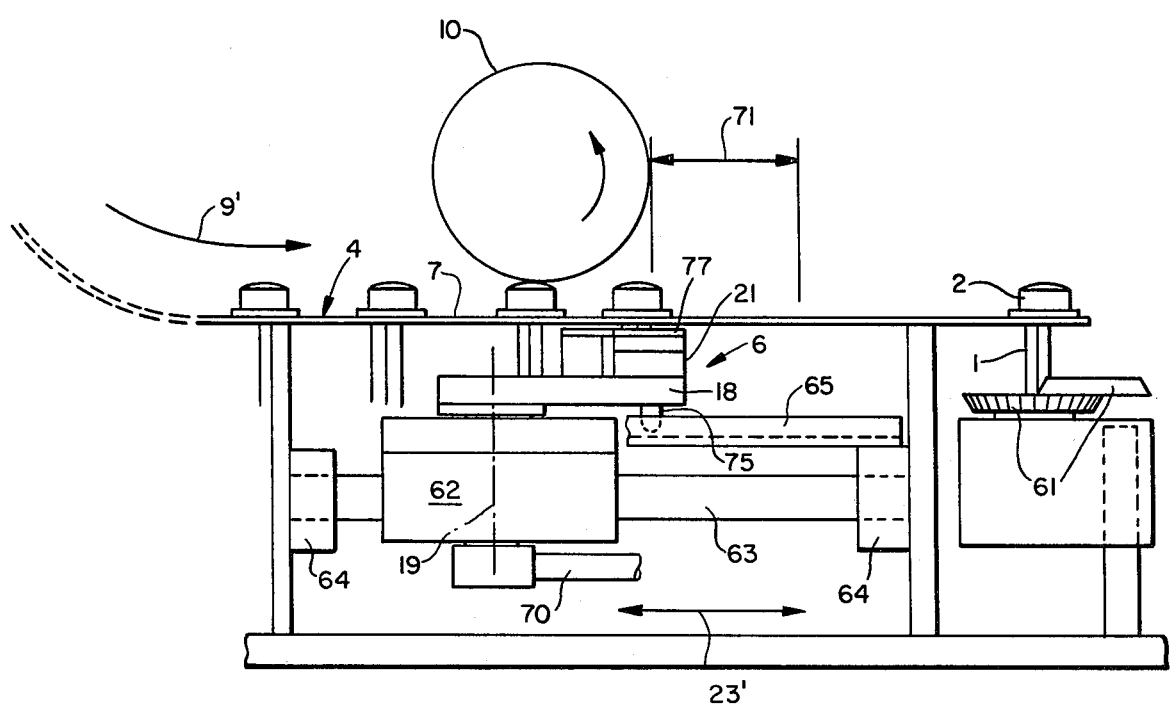
FIG. 10 is a view, similar to FIG. 7, of a still further embodiment.

It was explained above (by reference to FIG. 5) that the tools 21 can be provided with shearing tools 37 so that bending, kinking and cutting to length can be performed in one operation. It is also possible (as FIG. 10 shows in detail) for the operation of cutting to length to be performed in a separate cutting device disposed downstream. In this case, the guide slot 8 is extended without interruption at least as far as the cutting device which is disposed downstream, so that, after bending and kinking, the components 2 pass without any further manipulation into the cutting device.

Figure 7:
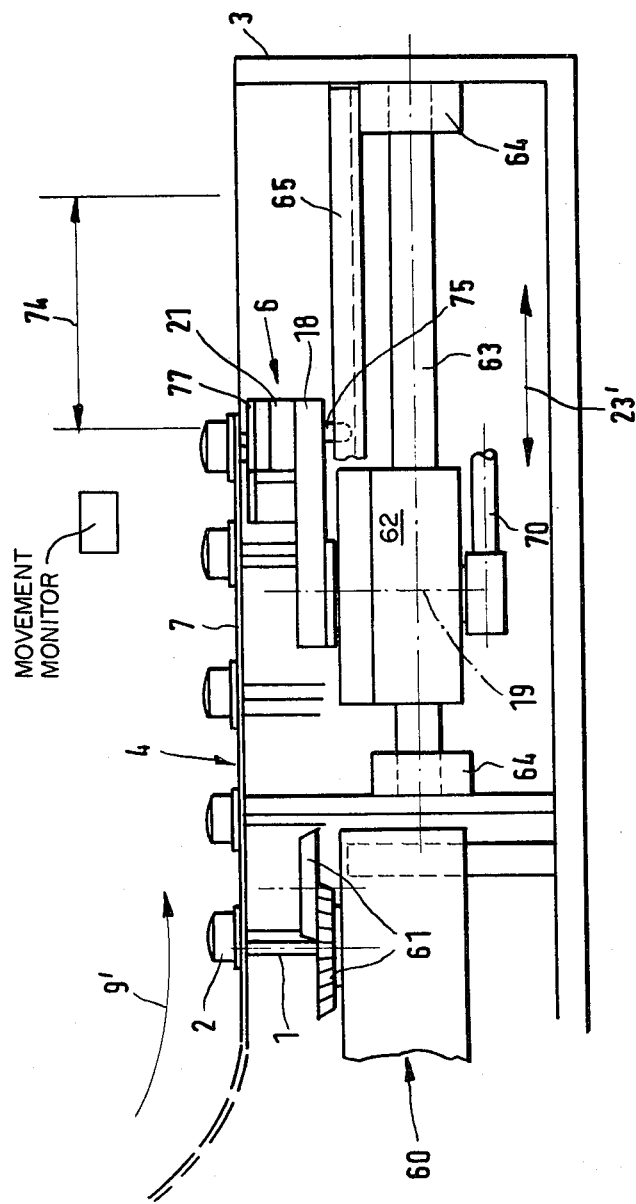
FIG. 7 is a side view of another embodiment of an apparatus for bending, kinking and cutting to length of the connecting wires of electrical components.
Figure 8:
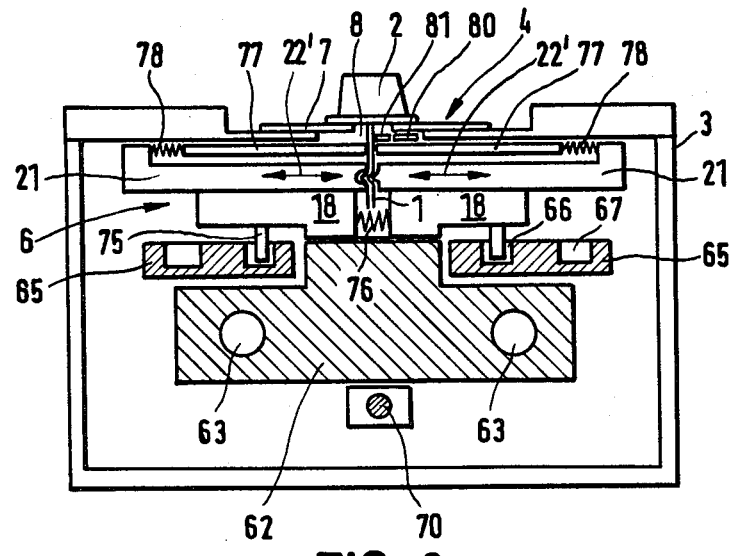
FIG. 8 is a cross section of the embodiment of FIG. 7.

Another embodiment of apparatus is illustrated in FIGS. 7 to 9, also intended for bending, kinking and cutting to length the connecting wires 1 of electrical component 2, more particularly, components such as transistors or the like, from which the connecting wires do not emerge coaxially at opposite sides, but emerge from a common casing side. Fundamentally, the apparatus comprises a machine frame 3, a component guide 4 disposed on the top of said machine frame, and a tool set 6, disposed beneath the component guide 4.

The component guide 4 is fixedly joined to the machine frame 3, is constructed as a guide way and substantially comprises two cheeks 7 of spring steel which are disposed parallel with each other and at a mutual distance from each other, are mounted on top of the machine frame and leave free a guide slot 8 between them. The component guide 4 is connected to a conveying device (not shown), which is also constructed as a guide way with a guide slot and through which the components 2 are supplied from a storage container, for example, a so-called vibratory cup.

The components 2 are supplied in the conveying direction indicated by the arrow 9' and the components 2 bear on the cheeks 7 of the component guide 4 and the connecting wires 1 extend downwardly through the guide slot and project into the operating range of the tool set 6. The components 2 can be supplied, for example, by the action of gravitational force or a friction drive (not shown) can be additionally provided.

Substantially, the tool set 6 comprises two tool supports 18, both of which are supported so as to be pivotable about a vertical axis 19. The distance between the tool support 18 and the component guide 4 is arranged so that the connecting wires 1, cut to the specified length by a cutting device 60, disposed upstream, can pass through without interference. Substantially, the cutting device 60 comprises two cutting wheels 61 whose circumferential cutting edges bear upon each other and of which one is provides with serrations and is rotatingly driven while the other idles. The tool supports 18 support the actual bending and kinking tools 21. A reciprocating closing motion in the direction of the double arrow 22' is imparted to the tools 21 in the manner described below, and said motion is performed in a plane which is perpendicular to the guide slot 8 and in a direction which is perpendicular to the guide slot 8.

The tool supports 18 are supported by a slide 62 so as to be pivotable about the axis 19. The slide 62 can traverse on a slide way, formed by two guide rods 63, in a direction which is parallel with the guide slot 8 and, therefore, perpendicular to the closing motion 22'. The slide motion will be described hereinafter as operating motion. The underside of the slide 62 has a rod 70 hinged to it, which is connected to a motor (not shown) by means of which the operating motion 23' is imparted to the slide 62. The rod 70 can be the piston rod of a cylinder-piston system or a connecting rod which is connected to an electric motor. Accordingly, the tool set 6 is traversable within the operating range 74. As indicated in FIG. 7, the component guide 4 terminates in the operating range 74 of the tool set 6, namely, in its beginning region.

The vertical distance between the tool set 6 and the component guide 4 can be adjusted by virtue of the fact that the rods 63 are retained by cross-members 64, which, in turn, are mounted on the machine frame 3 so as to be vertically adjustable. As a rule, this adjustment is made only when the apparatus is brought into operation. The tools 21 are vertically adjustable with respect to the tool supports 18 to adjust the vertical distance between the component member and the kinks which are to be formed on the connecting wires 1 to obtain the appropriate vertical setting in accordance with the prevailing processing task.

The closing motion 22' of the tool set 6 is synchronized with the operating motion 23'. To this end, a disc cam 65 is mounted on the cross-members 64 on each of the two sides of the slide 62. Each disc cam 65 has two control cams, namely, a closing cam 66 and an opening cam 67, which jointly form a closed path. The underside of each tool support 18 is provided with a control finger 75 which is guided by the associated disc cam 65 and, therefore, drives the tools 21 so that the closing motion 22' of the tool set 6 is performed in synchronism with the operating motion 23'. In addition, an opening spring 76 is provided by means of which the tool supports 8 are urged into the open position.

FIGS. 7 to 9 do not disclose the additional possibility by means of which the closing motion is imparted to the tools 21 by means of plunger magnets whose energization is controlled by controlled seitches that are actuated by a switch cam connected to the slide and arranged in the operating region. The manner in which the plunger magnets and control switches are to be arranged will be obvious to the experts skilled in the art; thus, a movement monitor for triggering tool set operation is only schematically depicted as an example.

FIG. 8 illustrates the manner in which pull relief elements in the form of holders and work holders are provided above the tools 21, are guided so as to have limited movability with respect to the tool supports 18 by means of stops (not shown) and are supported by springs 78. The purpose of the pull relief elements 77 is to absorb forces which are transmitted to the connecting wires 1 during bending and kinking. In setting up the illustrated apparatus, vertical adjustment of the cross-members 64 is performed so that the pull relief elements 77 are disposed closely beneath the cheeks 7 of the component guide 4 to ensure that the connecting wires 1 are gripped closely beneath the component casing.

Figure 9A:
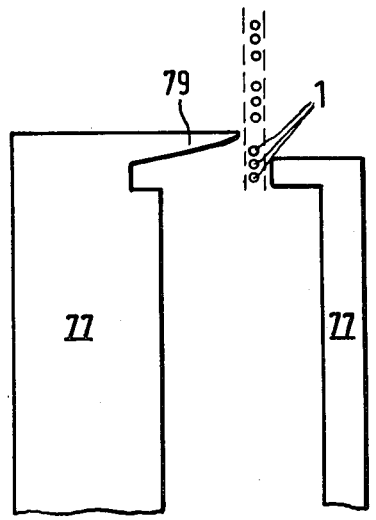
FIGS. 9a and b are partial elevations of the embodiment of FIG. 7, in two functional positions with the components guide removed.
Figure 9B:
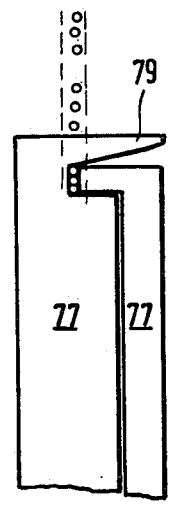

FIGS. 9a, b are plan views of the pull relief elements 77 in the open position (FIG. 9a) and in the closed position (FIG. 9b) with the component guide removed. The illustration discloses the manner in which a separating slide 79 is integrally formed on one of the two pull relief elements 77 in the region which is at the rear in the conveying direction 9. When the tools 21 are closed, the separating slide 79 is first guided beneath the component guide 4 into the path of the components 2 behind the leading component 2 which is to be processed. As closing progresses, the pull relief elements 77 bear upon each other and the connecting wires 1 are clamped between the pull relief elements. In the course of further closing of the tool set 6, controlled by the closing cmas 66 of the disc cams 65 by means of the control fingers 75, the bending and kinking tools 21 bear upon each other while the springs 78 are compressed and the connecting wires are clamped between said tools, and are bent and kinked. Subsequently, the tools are again opened and the machine component 2 is ejected, and a separate ejector lever can be provided to this end. An arrangement similar to that shown in FIGS. 4 and 5 may be employed for component ejection in this embodiment.

The above-described operation of the closing motion 22' is performed by virtue of the control of the tool supports 28 by the disc cams 65 in synchronism with the operating motion 23' of the tool set 6 and the slide 62. In the region of the rear dead centre of the operating motion 23', as seen in the conveying direction 9', the opening cam 67 merges with the closing cam 66 and the control finger 75 with the tool supports 18 approach each other, until, as already explained, the pull relief elements 77 clamp between them the connecting wires 1 of a component 2 which is to be processed. This is followed by the phase of the operating motion 23' in the conveying direction 9', during which motion the component 2 is removed from the guide slot 8. As motion continues in the conveying direction 9', the closing cams 66 cause the tool supports 18 to approach each other still further, so that, as already explained, the connecting wires 1 are first more firmly clamped between the pull relief elements 77 and are finally bent and kinked by the tools 21. The tool supports 18 again recede from each other no later than the front dead centre of the operating motion 23' in the conveying direction 9', where the closing cams 66 merge with the opening cams 67, so that the processed component 2 is ejected. Subsequently, the tool supports 8, with the tools 21 and the pull relief elements 77, are returned into their open position along the opening cams 67 to enable a further component 2 to be processed. To ensure that succeeding components are reliably retained in the component guide 4, while one component is being processed, one end of the guide slot 8 is closed by a resilient locking element 80, a cam 81 of which projects closely beneath the guide slot 8 into the path of the components 2. When a component 2 is removed, the spring force exerted by the locking element 80 is readily overcome by the tool set 6, but prevents the components 2, emerging by themselves, from the guide slot 8.

While I have shown and described various embodiments in accordance with the present invention, it is understood that the same is not limited thereto, but is susceptible of numerous changes and modifications as known to those skilled in the art, and I, therefore, do not wish to be limited to the details shown and described herein, but intend to cover all such changes and modifications as are encompassed by the scope of the appended claims.

What is claimed is:

1. An apparatus for preparing leads of electrical components, having connecting leads extending parallel to one another and only in one direction, with the apparatus having a conveying device adapted to supply the components, the conveying device being a non-moving component guide comprising a sliding guide with a guide slot, through which the connecting leads extend to project downwardly, and having a cutting device for cutting the connecting leads to length, said apparatus further comprising at least one tool set having two tools which are cooperable for shaping the connecting leads between them by bending and kinking, the tool set being disposed beneath the guide slot, at least one of the tools being operable to move against the other by a closing movement in a direction which is perpendicular to the guide slot, and both of the tools being jointly movable parallel to one another, within an operating range, in an operating movement, said closing movement of the tool set being synchronized with said operating movement in such a manner that the tools are closed during a part of the operating movement which takes place in a direction in which the components are conveyed and are opened in a direction opposite to the conveying direction.

2. Apparatus according to claim 1, characterized in that the component guide is associated with a friction drive for the components.

3. Apparatus according to claim 2, characterized in that the friction drive comprises at least one driving element in the form of a friction roller which is rotatably driven in the direction of the guide slot.

4. Apparatus according to claim 2, characterised in that the friction drive comprises at least one driving element in the form of a friction belt arranged to circulate in the direction of the guide slot.

5. Apparatus according to claim 1, characterised by a driving element arranged to act upon the top of the component members.

6. Apparatus according to claim 1, characterised by two driving elements arranged to act on opposite sides of the components.

7. Apparatus according to claim 1, characterised in that the tool set is disposed on a drive block which can be caused to rise and fall with respect to the guide slot.

8. Apparatus according to claim 1, characterised in that one of the tools associated with the tool set is fixed a constant distance relative to the guide slot and the other tool is movable relative thereto.

9. Apparatus according to claim 8, characterized in that a ramp, inclined with respect to the conveying direction, precedes the tool which is fixed to the machine.

10. Apparatus according to claim 1, characterised in that both tools of the tool set are adjustable.

11. Apparatus according to claim 1, characterised in that the tools can be moved into the closed position against the action of an opening spring.

12. Apparatus according to claim 1, characterised in that the tools can be moved into the open position by the tool drive.

13. Apparatus according to claim 1, characterised in that one of the tools is associated with an ejector lever by means of which the components are ejectable from the second tool after processing when the tools are opened.

14. Apparatus according to claim 1, characterised in that the guide slot is associated with a movement monitor and that operation of the tool set can be triggered by the movement monitor.

15. Apparatus according to claim 1, characterised in that the guide slot is associated with a component trap having at least one separating slide, adapted to block the guide slot and that the operation of the separating slide can be triggered by the drive of the tool set.

16. Apparatus according to claim 1, characterised in that the underside of the tools is provided with shearing tools.

17. Apparatus according to claim 1, characterised in that the tool set, adapted for bending, and kinking is followed by a cutting device and that the guide slot is extended, without interruption, at least as far as the cutting device.

18. Apparatus according to claim 1, wherein the guide slot is provided with boundaries (7) and one portion of at least one of the boundaries of the guide slot is adjustable in the region of the tool set relative to a second of the boundaries.

19. Apparatus according to claim 1, wherein the component guide terminates within the range of said operating movement.

20. Apparatus according to claim 19, characterised in that the closing motion and the operating motion are performable parallel with each other and substantially perpendicularly to the orientation of the guide slot and that a transfer slot, parallel with the operating motion, follows the guide slot.

21. Apparatus according to claim 1, characterised in that the operation motion is arranged to extend parallel with the guide slot and substantially perpendicularly to the closing motion.

22. Apparatus according to claim 1, characterised in that the tools are adjustably supported on a slide which is traversable in accordance with the operation motion and is guided in a guide way which is stationary with respect to the component guide.

23. Apparatus according to claim 22, characterised in that the guide way comprises two guide rods which are disposed parallel with each other beneath the component guide.

24. Apparatus according to claim 1, characterized in that the closing motion of the tools is provided by at least one plunger magnet (solenoid) and that energisation of the plunger magnet (solenoid) is controlled by control switches which are disposed along the operating region and can be actuated by the tool set or by the slide.

25. Apparatus according to claim 1, characterised in that the closing motion is arranged to be performed by at least one disc cam which is disposed alongside the operating range and at least one of the tools is connected to a control finger arranged to co-operate with the disc cam.

26. Apparatus according to claim 25, characterised in that the disc cams comprises a closing cam and an opening cam.

27. Apparatus according to claim 19 wherein pull relief elements are disposed above the tools, and the tools are vertically adjustable with respect to the slide, independently of the pull relief element.

28. Apparatus according to claim 1, characterised in that in the region which is at the rear is the conveying direction, a separating slide is fixedly connected to at least one of the tools and/or to pull relief elements if present.

29. Apparatus according to claim 1, characterised in that one end of the guide slot is closed by a spring-biased locking element.

30. Apparatus according to claim 1, characterised in that a cutting device is disposed upstream of the tools in the conveying direction and below the guide slot.

* * * * *